United States Patent [19]

Tullsen

[11] Patent Number: 4,839,788
[45] Date of Patent: Jun. 13, 1989

[54] BIPOLAR VOLTAGE TO FREQUENCY CONVERTER

[75] Inventor: Thomas R. Tullsen, San Jose, Calif.

[73] Assignee: Dionex Corporation, Calif.

[21] Appl. No.: 150,139

[22] Filed: Jan. 29, 1988

[51] Int. Cl.[4] .............................................. H02M 7/02
[52] U.S. Cl. ........................................ 363/63; 328/13; 328/26; 307/261; 307/262
[58] Field of Search ................... 363/1, 8, 63; 307/260, 307/261, 262; 328/13, 26, 28

[56] References Cited

U.S. PATENT DOCUMENTS 4,491,773  1/1985  Smith et al. ....................... 307/262
4,518,877  5/1985  Hearn et al. ........................ 328/26

Primary Examiner—Peter S. Wong
Attorney, Agent, or Firm—Flehr, Hohbach, Test, Albritton & Herbert

[57] ABSTRACT

A bipolar voltage to frequency converter which utilizes a single operational amplifier for generating appropriate signals representative of the frequency and signs of a bipolar input signal. The present invention has applications in chemical chromatography, absorption meters and data acquisition systems.

6 Claims, 6 Drawing Sheets

BIPOLAR VOLTAGE TO FREQUENCY CONVERTER

BACKGROUND OF THE INVENTION

The present invention relates to a bipolar voltage to frequency converter for use in applications such as chemical chromatography, absorption meters and data acquisition systems.

A voltage to frequency converter is commonly used to convert analog electronic signals representing some quantity of interest (such as voltage amplitude) to digital electronic signals coded to represent numerical values. Such converters are used throughout the electronic industry.

Prior art approaches have in general utilized a unipolar voltage to frequency converter. The prior art, however, present some problems in electronic applications in that such voltage to frequency converters cannot output negative numbers, since there is only one frequency output line with no sign (i.e., whether the frequency is positive or negative).

Negative inputs are handled by offsetting the input (adding a fixed voltage that is summed with the signal). Thus, when an input signal swings negative, the output swings from the offset value to a smaller positive value. Equivalent offset must be subtracted digitally by some means in order to produce negative numerical values. The offset generator is a source of noise and drift, which can present errors in the desired output.

SUMMARY OF THE INVENTION

It is an object of the present invention to provide an improved bipolar voltage to frequency converter.

Briefly, the bipolar voltage to frequency converter comprises a single integrator means responsive to a first bipolar input signal of varying voltage magnitude. The single integrator means generates a second signal representative of a certain polarity (e.g., positive) when the input signal is positive, and representative of another polarity (e.g., negative) when the input signal is negative. The converter further includes first means responsive to the second signal only when having the certain polarity for generating a pulsed signal corresponding to the positive polarity, and means responsive to the second signal only when having said another polarity for generating another pulsed signal corresponding to the negative polarity.

Other objects, features and advantages of the present invention will become apparent from the following detailed description when taken in conjunction with the accompanying drawings.

DETAILED DESCRIPTION OF THE DRAWINGS

As described above, the present invention relates to a bipolar voltage to frequency converter for use in such applications as chemical chromatography, absorption meters, and data acquisition systems.

Figure 1:
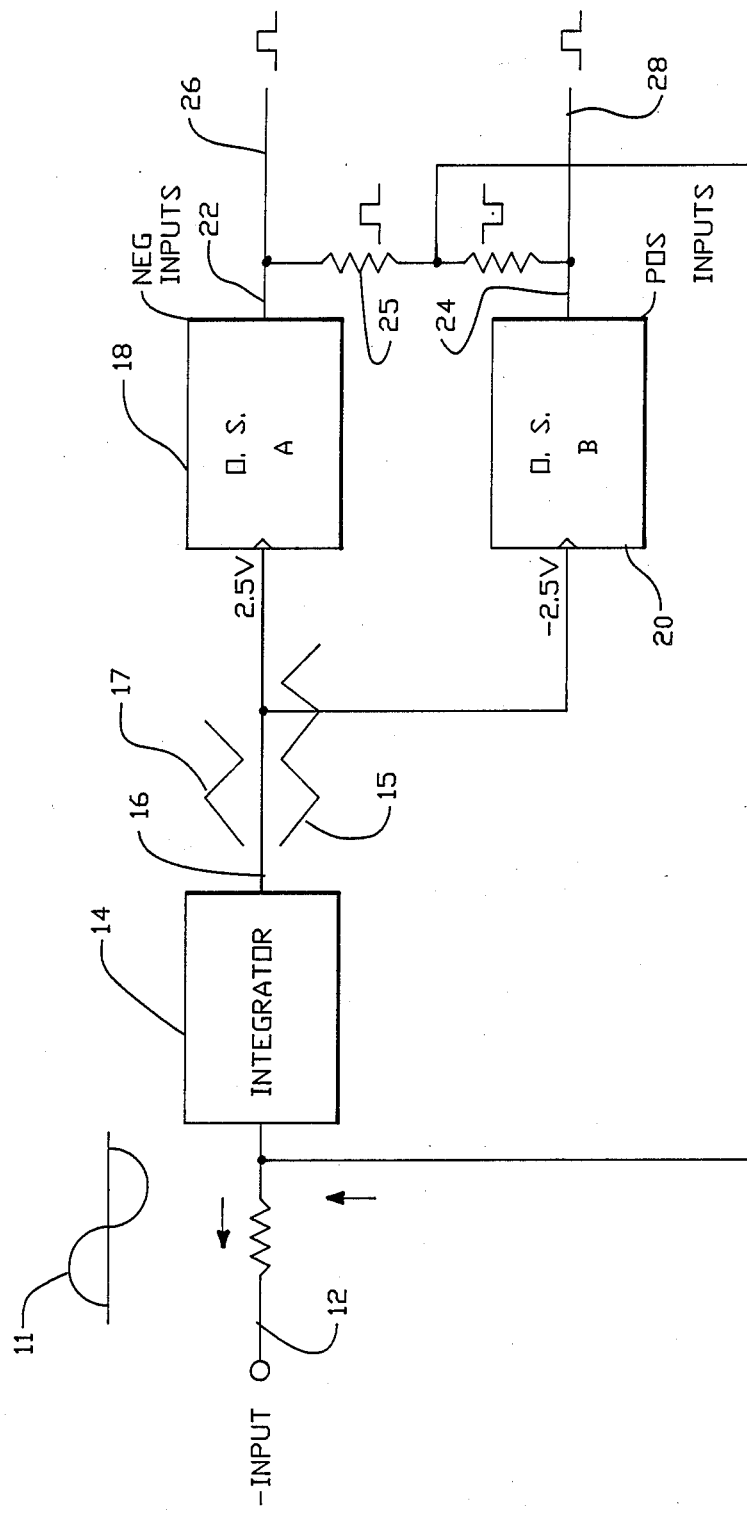
FIG. 1 depicts a block diagram of a bipolar voltage to frequency converter according to the present invention.

FIG. 1 depicts a block diagram of a bipolar voltage to frequency converter 10 according to the present invention.

In FIG. 1, a bipolar voltage signal 11 input on lead 12 is input to integrator 14. In a preferred embodiment, integrator 14 incorporates a single operational amplifier, the details of which will be described in more detail in conjunction with FIG. 2.

In operation in FIG. 1, integrator 14 will have either a positive or negative output in response to the polarity of the bipolar input signal. If the input signal 11 is negative, integrator 14 generates a ramp signal 17 on lead 16, which goes positive. When ramp signal 17 reaches a predetermined threshold (say, 2.5 volts), it triggers a one-shot multivibrator 18 (OS 18). OS 18 outputs a positive pulse on lead 22, which is fed back on lead 23 through resistor 25 to the input of integrator 14. This drives signal 17 negative, as indicated in FIG. 1.

For a positive going input signal 11, integrator 14 generates a negative ramp signal 15 which is input to one-shot (OS) 20, which generates a negative pulse on lead 24 for input back to integrator 14.

The outputs of OS 18 and OS 20 are output on leads 26, 28 to represent, respectively, positive and negative pulses corresponding to the polarity of input signal 11.

Outputs 26, 28 can represent, if desired, a positive frequency and a negative frequency. Outputs 26, 28 could be input to an up/down counter to provide for precise frequency representations based upon the voltage amplitude of input signal 11, as will be described below.

Figure 2:
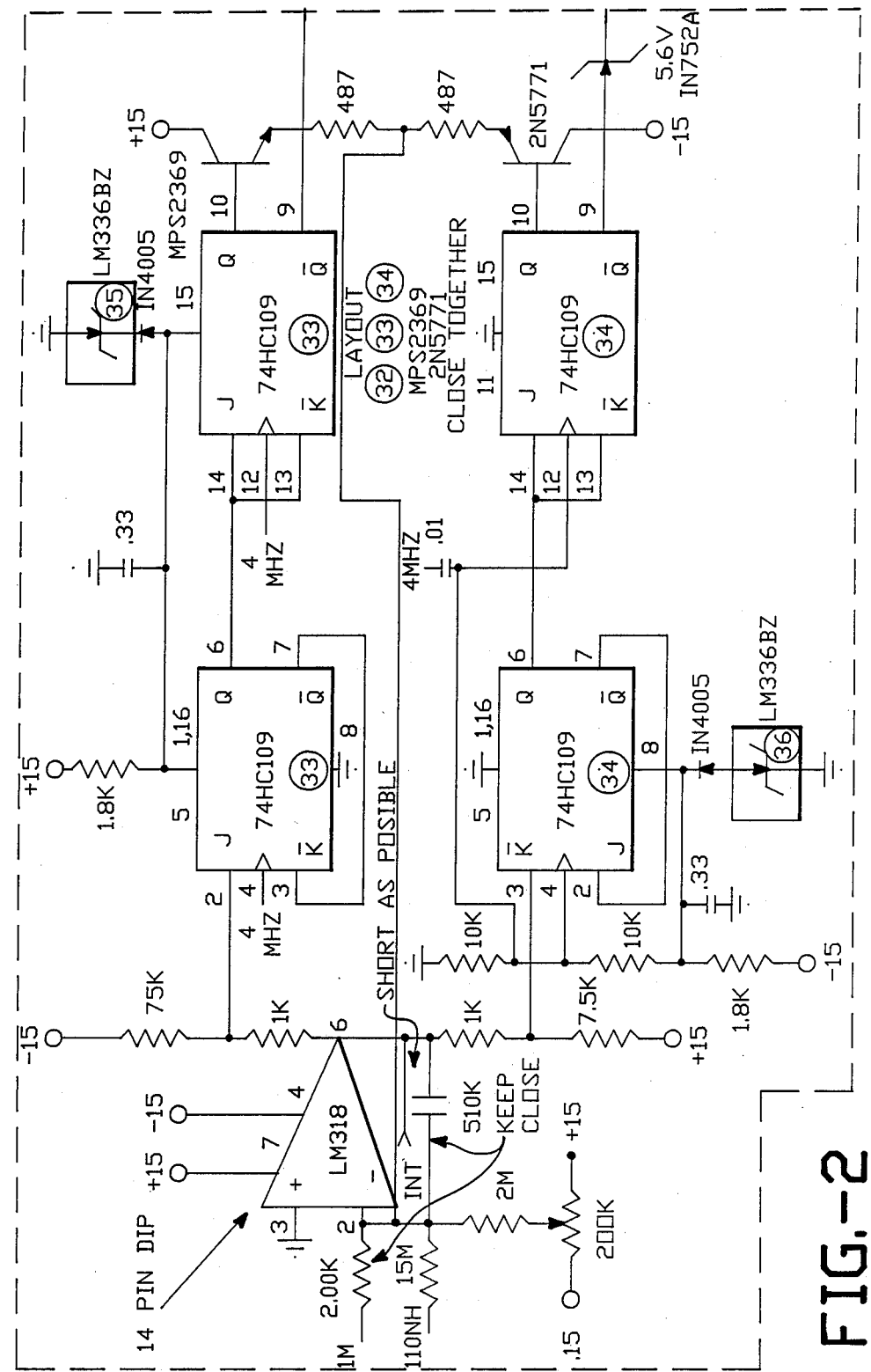
FIG. 2 depicts a more detailed schematic diagram of the bipolar voltage to frequency converter of FIG. 1.

Referring now to FIG. 2, a more detailed schematic diagram of the converter of FIG. 1 is depicted.

In FIG. 2 a single operational amplifier 32 (typically LM318) provides the desired voltage to frequency capability, according to one aspect of the present invention.

The integrator (LM318) provides an input to flip-flops 33, which correspond to the OS 18 of FIG. 1.

An output of the operational amplifier 32 of FIG. 2 is also input to flip-flops 34, which correspond to OS 20 of FIG. 1.

Each flip-flop 33, 34 dispenses a fixed quantity of charge when the integrator 32 output surpasses the logic threshold of the flip-flops 33, 34. The dispensed charge applied to the integrator 32 input drives the integrator 32 output toward zero. A positive input applied to the 2K resistor of FIG. 2 causes the integrator 32 output to swing negative. This allows flip-flop 34 to trigger.

A negative input to the 2K resistor allows flip-flop 33 to trigger. Thus, either polarity of input causes a train of output pulses from one of the two outputs. These two outputs may be combined using an up/down counter, as in the preferred embodiment, to produce both a numerical value and a sign.

The advantage of the present method is that when converting small signals (near zero volts), the current through the 2K resistor is low, thus eliminating it as a source of drift. As previously stated, the problems of noise and drift associated with prior art generators is eliminated.

Figure 3:
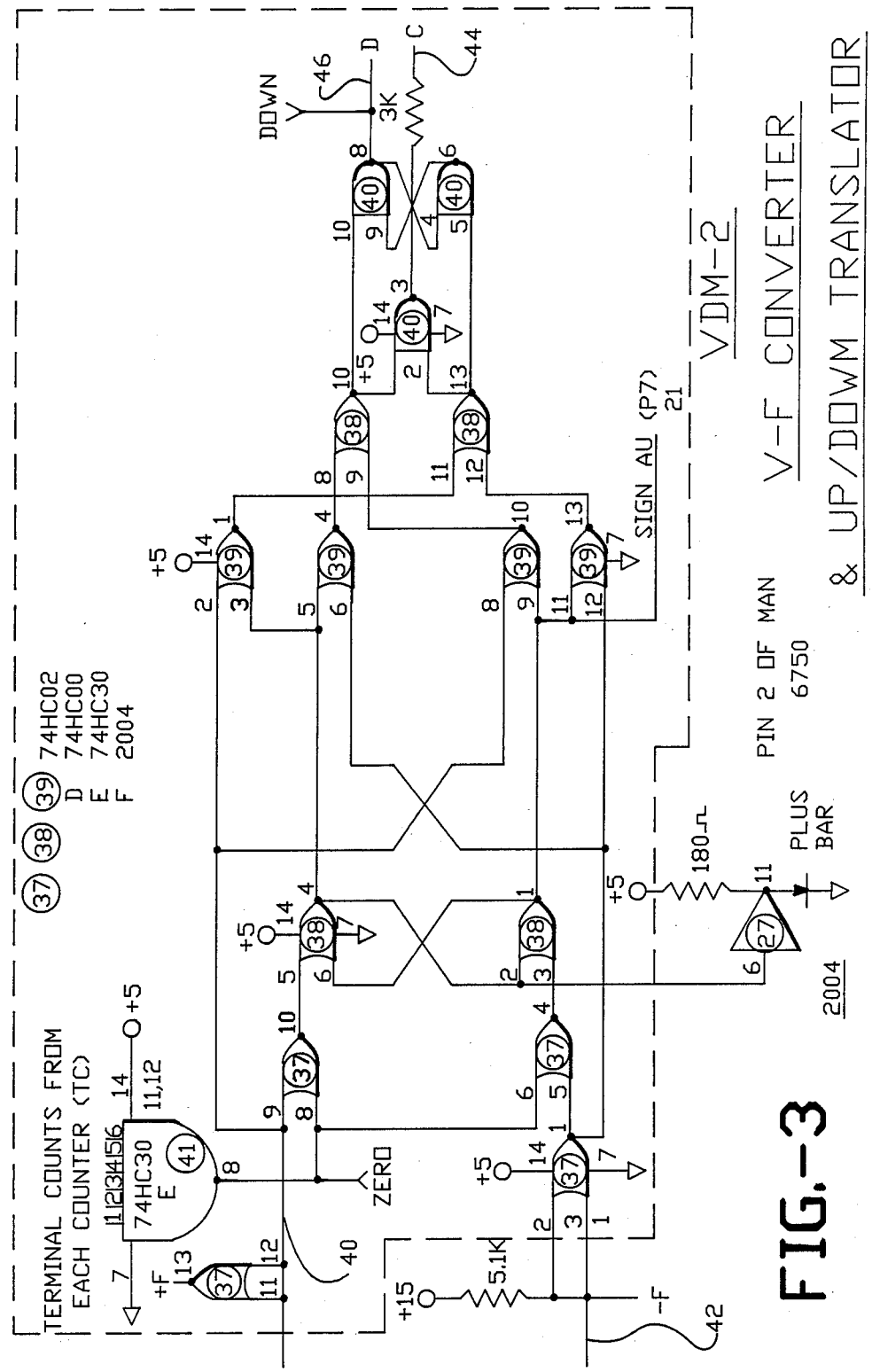
FIG. 3 depicts a logic diagram for utilization with the converter of FIG. 2.

Referring now to FIG. 3, a logic diagram is depicted therein for receiving the positive and negative pulse trains of FIG. 2.

The logic diagram of FIG. 33 takes the positive pulse train at lead 40 and the negative pulse train at lead 42 and produces a single frequency output at lead 44. Also, logic circuit of FIG. 3 produces a sign output at lead 46.

Outputs 44, 46 can be put into an up/down counter such as depicted in FIG. 4, which tell the counter which way to count.

The translator depicted in FIG. 3 receives two pulse trains, one of which represents the negative frequency and one of which represents the positive frequency. An output is a single pulse train on lead 44, which represents the frequency, and a signal on lead 46 which represents the sign of the output frequency.

As previously described, these two outputs can be input to an up/down counter. The negative pulses will automatically be subtracted from the positive pulses so that the result is the difference between the two, which is what is desired. This allows a signal of varying polarity or a noisy signal to be averaged over whatever time interval is desired, thus putting this circuit in the category of an "integrating" converter.

Figure 4A:
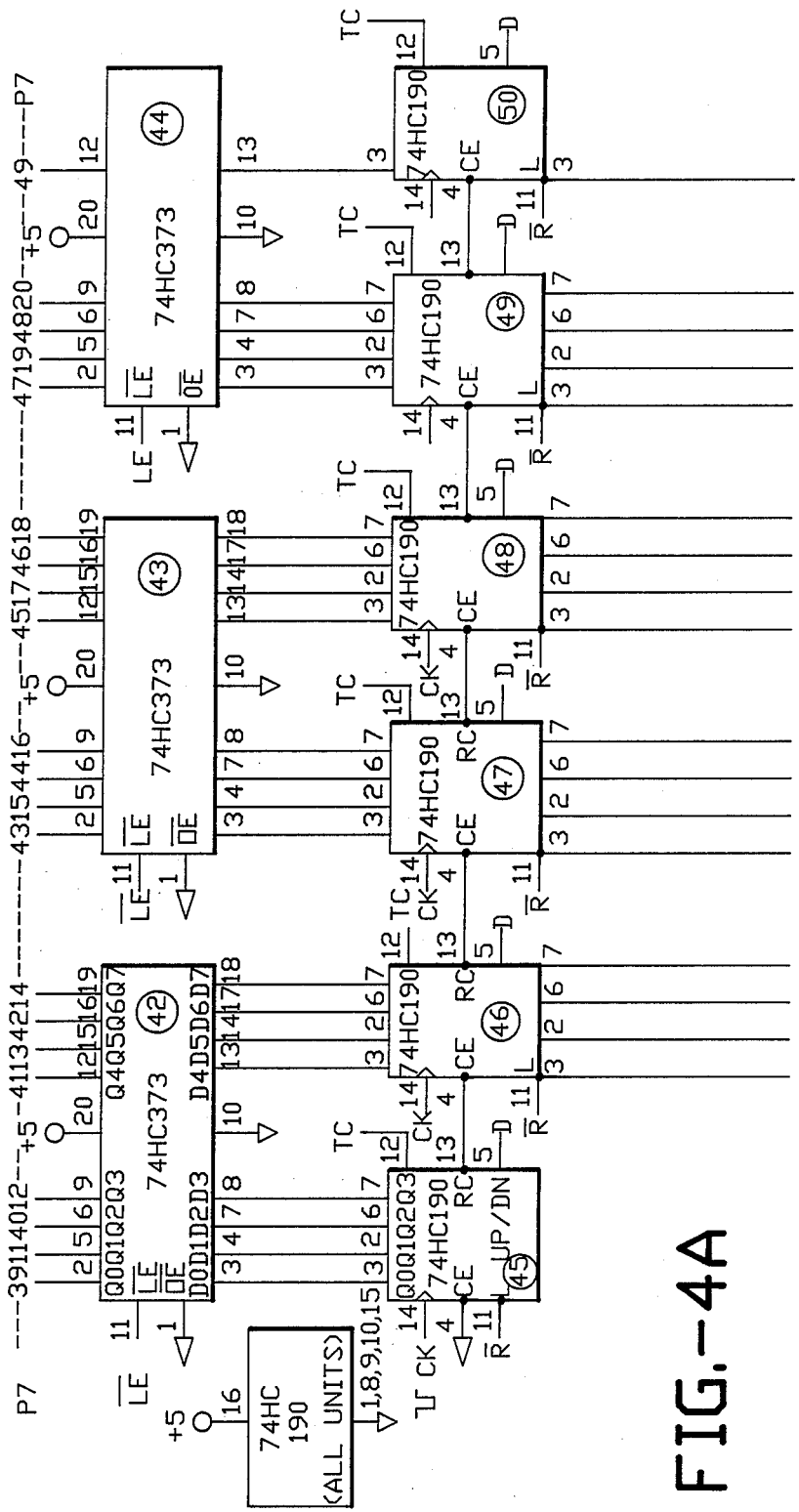
FIGS. 4A–4C depict diagrams of a counter circuit for use with the present invention depicted in FIG. 1.
Figure 4B:
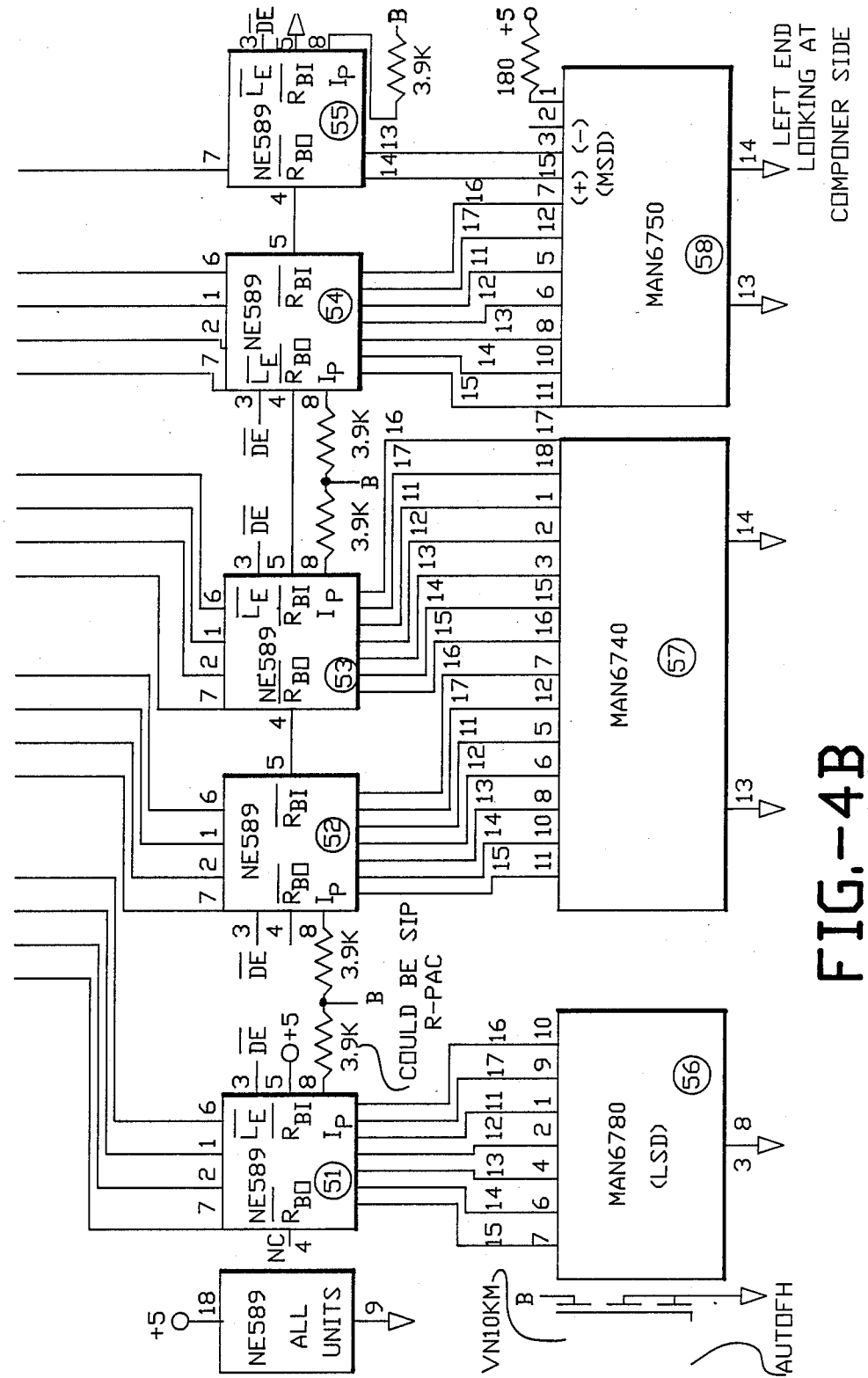
Figure 4C:
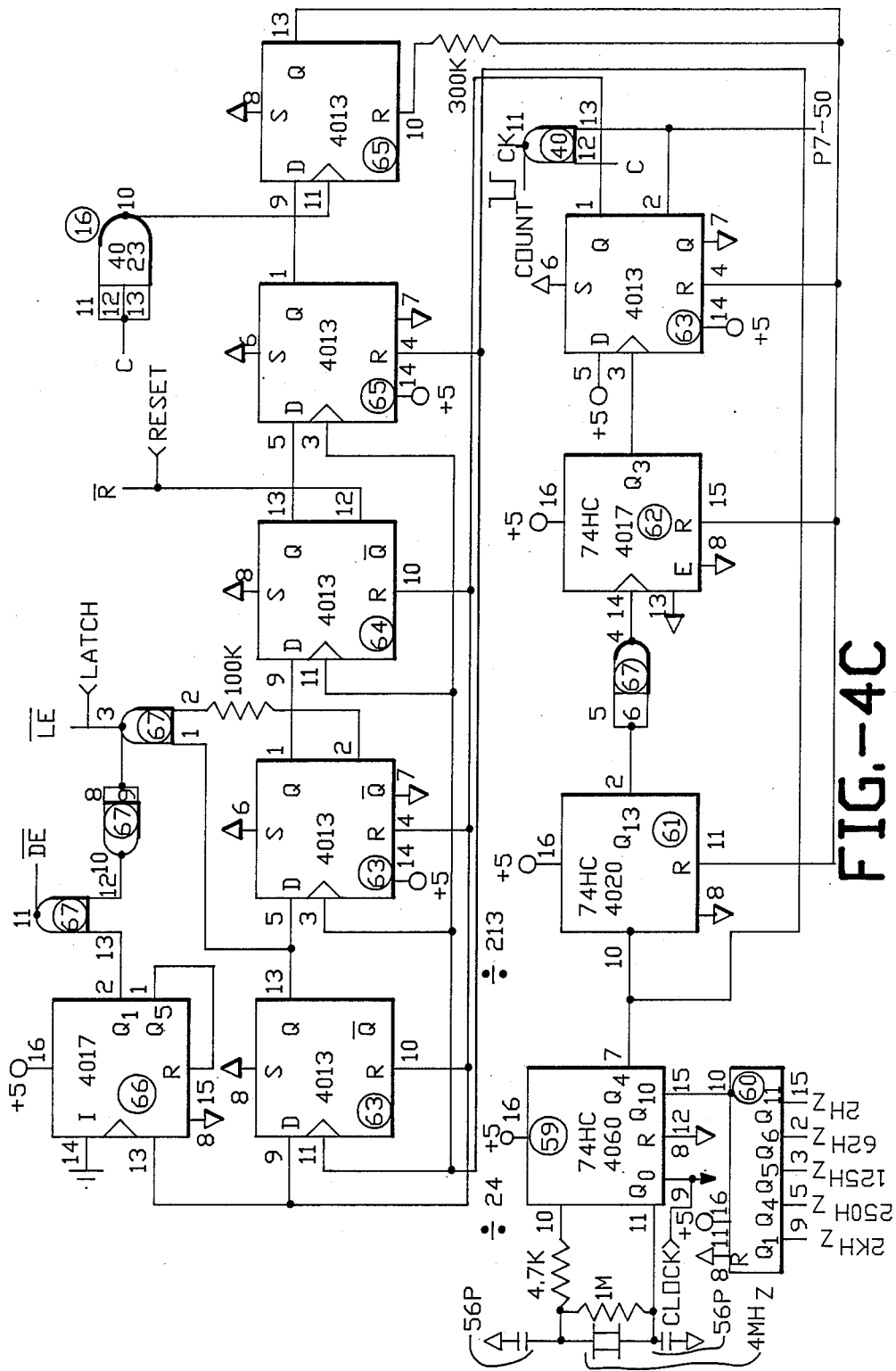

FIGS. 4A to 4C depict diagrams of an up/down counter configuration. With the utilization of an up/down counter, the present invention does not require any further mathematical operations. The "count" starts at zero, and either goes positive or negative, depending on the frequency and sign of the input components from FIG. 3.

The schematic components depicted in FIG. 2, 3 and 4A to 4C are illustrated within the respective blocks, and correspond to components well known throughout the art.

Referring again to FIG. 2, the use of a single operational amplifier 32 (LM318) provides advantages over the state of the prior art.

By using a single operational amplifier, it is impossible for the sign to be wrong. It is impossible for the sign to be changing at any point other than zero frequency.

In the prior art, a pair of operational amplifiers (or comparators) are usually required where one operational amplifier is looking at the polarity and the other is generating a unipolar frequency.

With the present invention and the use of a single operational amplifier, the problems associated with prior art approaches are avoided.

Further emphasizing the use of a single operational amplifier, the problem with prior art approaches is that with two operational amplifiers, there is usually an error zone, in which the sign is wrong for the frequency that is being generated. This error zone occurs because, with two operational amplifiers, the converter can never make the zero detection circuit detect zero at the exact same point that the frequency generating circuit is gone to zero.

The error band depends on the offset drift of the operational amplifiers. With utilization of a single operational amplifier, the foregoing problem is eliminated, and the sign is always correct.

The present invention has been described in connection with a digital environment, as disclosed in FIGS. 2-4 of the drawings. However, an analog type of approach could be implemented depending on specific applications. The aspects of the present invention therefore apply to either a purely digital and/or analog environment, depending on specific applications.

What is claimed is:

1. A bipolar voltage to frequency converter comprising
   a single integrator means responsive to a first bipolar input signal of varying voltage magnitude for generating a second signal representative of one polarity when said input signal has a positive polarity, and representative of another polarity when said input signal has a negative polarity,
   first means responsive to said second signal only when having said one polarity for generating a pulsed signal corresponding to said positive polarity, and
   second means responsive to said second signal only when having said another polarity for generating another pulsed signal corresponding to said negative polarity.

2. A converter as in claim 1 wherein said integrator means comprise a single operational amplifier.

3. A converter as in claim 2 wherein said first and second means further include a pair of one-shot multivibrators, respectively, for generating said first and second signals.

4. A converter as in claim 1 including an up/down counter responsive to said first and second signals, respectively, and wherein said first and second signals represent the frequency and polarity of the pulsed signals, respectively.

5. A bipolar voltage to frequency converter comprising
   a single integrator means responsive to a first bipolar input signal for generating a second signal representative of one polarity when the input signal has a positive polarity, and representative of another polarity when said input signal has a negative polarity,
   first means responsive to said second signal only when having said one polarity to generating a pulsed signal corresponding to said positive polarity,
   second means responsive to said second signal only when having said another polarity for generating a pulsed signal corresponding to said negative polarity, and
   means for connecting the outputs of said first and second means to said single integrator means when a predetermined threshold value is reached.

6. In a bipolar voltage to frequency converter, the method comprising the steps of
   generating, in response to a first bipolar input signal of varying voltage magnitude, a second signal representative of one polarity when said input signal has a positive polarity, and representative of another polarity when said input signal has a negative polarity,
   generating a pulsed signal having a frequency corresponding to the voltage magnitude of said positive polarity only when said second signal has said one polarity, and
   generating a pulsed signal having a frequency corresponding to the voltage magnitude of the negative polarity only when said second signal has said another polarity.

* * * * *